United States Patent [19]

Scampini

[11] Patent Number: 5,629,622

[45] Date of Patent: May 13, 1997

[54] MAGNETIC FIELD SENSE SYSTEM FOR THE PROTECTION OF CONNECTED ELECTRONIC DEVICES

[75] Inventor: Steven A. Scampini, Bedford, Mass.

[73] Assignee: Hewlett-Packard Company, Palo Alto, Calif.

[21] Appl. No.: 501,264

[22] Filed: Jul. 11, 1995

[51] Int. Cl.$^6$ .......................... G01R 33/02; G01R 33/07; A61B 5/055; H02H 7/00

[52] U.S. Cl. ...................... 324/247; 128/653.2; 324/251; 324/260; 340/600; 361/93

[58] Field of Search ...................... 324/345, 244, 324/247, 251, 258, 260, 67, 72; 128/653.1, 653.2; 340/551, 600; 361/1, 71, 90–93

[56] References Cited

U.S. PATENT DOCUMENTS

| | | | |
|---|---|---|---|
| 3,418,572 | 12/1968 | Humphreys, Jr. | 324/67 |
| 4,954,812 | 9/1990 | Lebron | 324/260 X |
| 5,256,960 | 10/1993 | Novini | 324/247 X |
| 5,311,130 | 5/1994 | Bill et al. | 324/251 X |
| 5,512,823 | 4/1996 | Nepveu | 324/260 X |

*Primary Examiner*—Gerard R. Strecker

[57] ABSTRACT

A protective circuit controls electronic equipment in the presence of a high level electro-magnetic field. The protective circuit includes a field sensor arrangement which provides output signals that are indicative of magnetic field strength components that are aligned along desired spatial axes. A vector converter circuit is connected to the field sensors and provides an output having a magnitude that is indicative of the vector sum of the electro-magnetic field strength components. A first indicator is responsive to an output from the vector converter reaching a first threshold to manifest a caution signal that the magnetic field strength has reached a cautionary level. A second indicator is responsive to an output from the vector converter reaching a second threshold that is higher than the first threshold, to disable the electronic equipment. Further circuitry is provided to re-enable the electronic equipment if it is moved outside of the area where the magnetic field exceeds the first threshold.

8 Claims, 2 Drawing Sheets

MAGNETIC FIELD SENSE SYSTEM FOR THE PROTECTION OF CONNECTED ELECTRONIC DEVICES

FIELD OF THE INVENTION

This invention relates to magnetic field sensors and, more particularly, to a magnetic field sensor that is employed in conjunction with an electronics device and controls the operation of the electronic device in accordance with the level of a sensed electro-magnetic field.

BACKGROUND OF THE INVENTION

Magnetic resonance imaging (MRI) systems include large magnetic coil structures which create intense magnetic fields in their immediate vicinity. Within an aperture in the coil structure (where a patient is placed), field strengths may be in the range of 2000 Gauss—15,000 Gauss. While the field intensity rapidly decreases with increasing distance from the coil structure, it is known that high residual magnetic fields are still present within the MRI radio frequency (RF) enclosure. For this reason, great care is taken to assure that no magnetic items are allowed to enter the MRI RF enclosure or to be brought into the vicinity of the MRI coil structure.

Certain patient diagnostic procedures are now carried out while the patient is within the MRI unit. During those procedures, it is necessary that the patient's vital signs be monitored. In prior art systems, monitoring equipment had to be located in areas previously determined to have safe magnetic field levels, resulting in limited flexibility in the use of such equipment.

While it is preferred that certain monitoring electronic equipment be maintained within the MRI RF enclosure, there is always a danger that a technician may, in the process of moving the electronic equipment, bring it into a high field intensity area. Such a field can either cause damage to the equipment or distort the patients signals being processed in such a manner as to either mask the patient's vital signs or alter the patient's signals to such an extent that an emergency situation is signalled incorrectly or, potentially more seriously, an emergency signal is masked as a false normal.

Accordingly, there is a need for electronic equipment that can be emplaced within an RF enclosure of an MRI unit and still operate in a manner that assures that accurate patient vital sign signals are produced. Further, there is a need to protect the electronic equipment in the event a technician brings it too close to the MRI unit.

SUMMARY OF THE INVENTION

A protective circuit controls electronic equipment in the presence of a high level electro-magnetic field. The protective circuit includes a field sensor arrangement which provides output signals that are indicative of magnetic field strength components that are aligned along three orthogonal spatial axes. A vector converter circuit is connected to the field sensors and provides an output having a magnitude that is indicative of the vector sum of the electro-magnetic field strength components. A first indicator is responsive to an output from the vector converter reaching a first threshold to manifest a caution signal that the magnetic field strength has reached a cautionary level. A second indicator is responsive to an output from the vector converter reaching a second threshold that is higher than the first threshold, to disable the electronic equipment. Further circuitry is provided to re-enable the electronic equipment if it is moved outside of the area where the magnetic field exceeds the first threshold.

DETAILED DESCRIPTION OF THE PREFERRED EMBODIMENT

Figure 1:
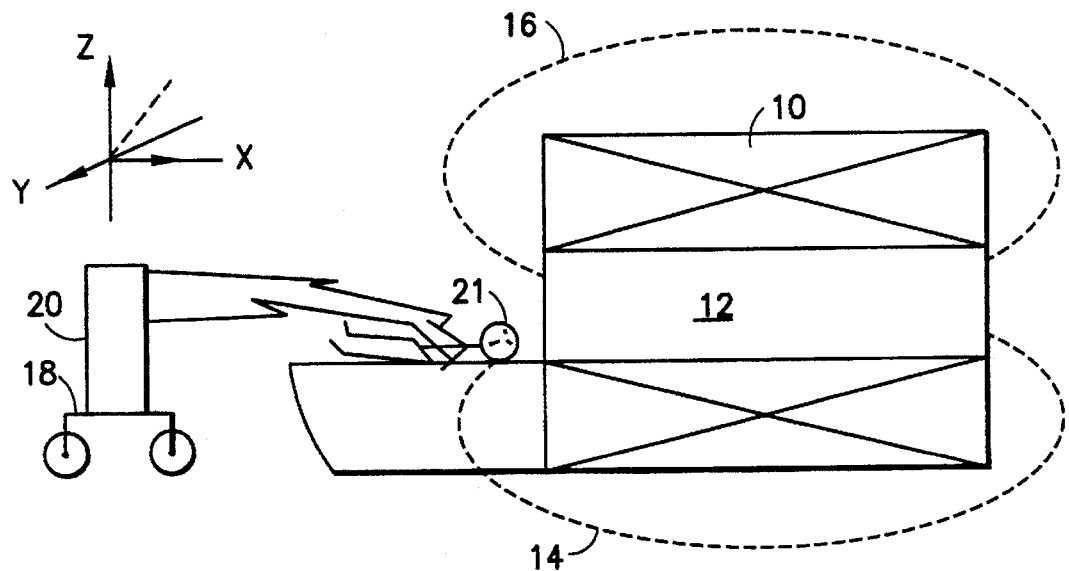
FIG. 1 is a schematic indicating an MRI unit and a transportable electronic monitoring system attached to a patient.
Figure 2:
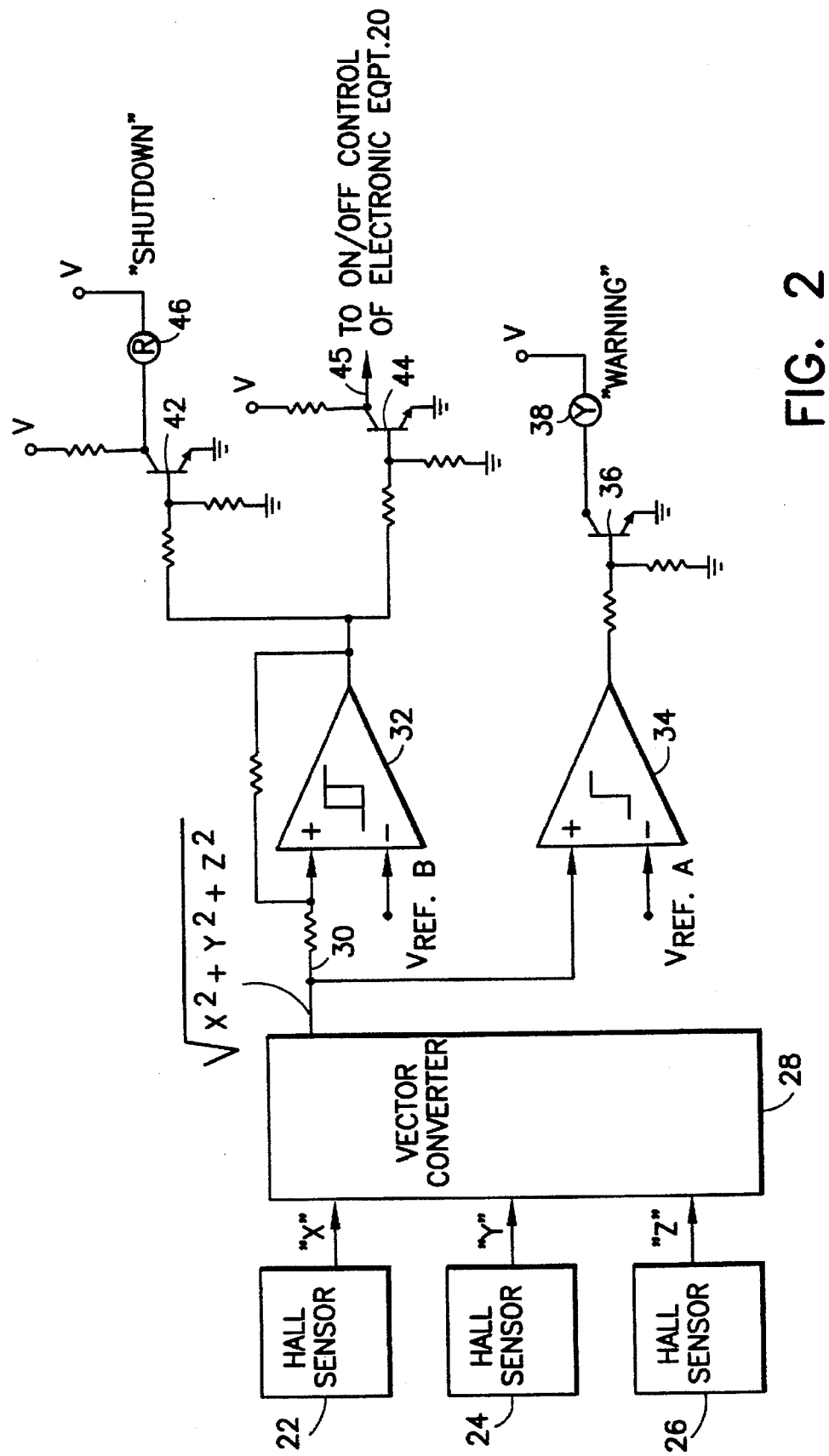
FIG. 2 is a diagram of a protective circuit that embodies the invention hereof.

In FIG. 1, an MRI 10, when operational, generates a high intensity electro-magnetic field within its core 12. The magnetic field also extends outside the core, as illustrated by field lines 14 and 16. A wheel mounted trolley 18 includes electronics equipment 20 mounted thereon for monitoring of vital signs of a patient 21. Electronics equipment 20 is provided with a protective circuit, the details of which are shown in FIG. 2. When trolley 18 is maneuvered into the vicinity of MRI unit 10, it is possible that a technician may cause electronics equipment 20 to approach too closely to the magnet and cause its exposure to very high field strengths.

A protective circuit within electronics equipment 20 is shown in FIG. 2 and includes three Hall device field sensors 22, 24, and 26 that are respectively oriented to sense component field strengths aligned with axes of a Cartesian coordinate system associated with the arrangement of sensors 22, 24 and 26. Hall sensor 22 is oriented so as to provide a signal output that is indicative of a field component oriented along the X axis (see FIG. 1). Hall sensor 24 is positioned to provide a signal output indicative of a field component oriented along the Y axis and Hall sensor 26 is positioned to provide a signal output indicative of a field component oriented along the Z axis.

Each of Hall sensors 22, 24 and 26 feeds its respective output to a vector converter 28 which, in turn, provides a voltage output whose value is equal to the square root of the sum of the squared values of each of the sensor outputs. The resulting potential on line 30 is equal to the absolute value of the vector sum of each of the X, Y and Z field components sensed by Hall sensors 22, 24 and 26. Vector converter 28 is a commercially available circuit and comprises three vector converter modules AD637, available from Analog Devices Inc.

The vector converter output is applied to comparators 32 and 34. A pair of reference voltages A and B are also applied to comparators 32 and 34 and enable their outputs to exhibit a step value when a voltage on line 30 exceeds a respective reference voltage. Comparator 34 exhibits a hysterisis which causes its output, once high, to remain high until its input level is reduced to a level that is a set value less than the input level which caused its output to traverse to the high state.

Reference voltage A is set to a level that is indicative of an output from voltage converter 30 when the sensed vector field strength value reaches a warning state. Thus, when the potential on line 30 exceeds reference voltage A, the output of comparator 34 rises to a high level which causes transistor 36 to become conductive. As a result, a yellow indicator light 38 is illuminated and provides a warning that the field strength in the vicinity of electronic equipment 20 has reached a warning state.

Voltage reference B is set at a higher level than voltage level A and is indicative of a signal output from vector converter 28 that occurs when the sensed vector field strength has reached a level where equipment damage or significant signal degradation can occur. Under such condition, comparator 32 provides a high output which renders transistors 42 and 44 conductive. The conduction of transistor 42 turns on red shutdown indicator light 46. The conduction of transistor 44 provides a negative voltage swing on collector line 45 which is recognized by an on/off control input (not shown) of electronic equipment 20 as a shutdown signal. In response, electronic equipment shuts down it's operations until a positive voltage shift is again sensed on collector line 45.

If the operator thereafter removes electronic equipment 20 from a region of high field strength so that the output on line 30 falls below reference voltage A, by at least the hysteresis level in comparator 32, the output of comparator 32 drops to a low level. That action renders transistors 42 and 44 nonconductive which turns off shutdown indicator light 46 and turns on electronic equipment 20.

Figure 3:
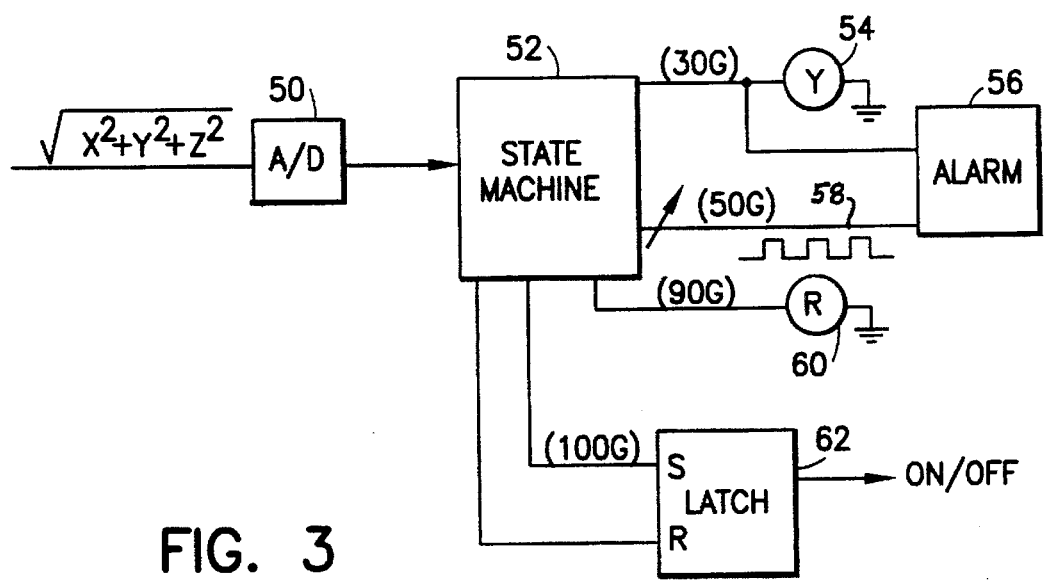
FIG. 3 is a further embodiment of a portion of the protective circuit that enables plural indications of alarm states.

Turning to FIG. 3, a digital version of the circuit shown in FIG. 2 is illustrated. The output from vector converter 28 is applied to an analog/digital (A/D) converter 50 which, in turn, provides its output to a state machine 52. As an example, state machine 52 may respond to an input potential from A/D converter 50 that is equivalent to a 30 Gauss vector field quantity to illuminate yellow warning light 54. At the same time, an audible alarm 56 will be energized to indicate that caution should be observed.

If the detected field strength output from A/D converter 50 exceeds 50 Gauss, an oscillation signal is applied to alarm 56 via line 58 which serves to modulate the tone of alarm 56 at an initial frequency. As the measured field strength increases, the frequency of modulation of alarm 56 also increases, indicating that the apparatus is experiencing higher field strengths. At an indicated field strength of 90 Gauss, state machine 52 illuminates red light 60 which indicates that shutdown is imminent. Finally, when an output from A/D converter 50 manifests a field strength of 100 Gauss or greater, an output is fed to latch 62 which outputs a negative-going voltage swing which disables electronic equipment 20 in the manner above described. Only when the sensed field strength falls beneath a preset level is latch 62 reset, thereby providing a positive-going voltage swing to reestablish operation of electronic equipment 20.

As indicated above, vector converter 28 computes a vector sum of the three sensor outputs by calculating the square root of the sum of the squares and supplies a voltage proportional to the vector magnitude of the sensed field to both the audio alarm and the state machine 52. Vector computation allows for a more accurate characterization of an incident magnetic field than if comparators were used with each Hall sensor. Inherent in the computation of the vector value, vector converter 28 calculates and uses the square of the sensor voltages and hence is able to sense bipolar magnetic fields with equal performance ability. The output of vector convertor 28 can either be linear or logarithmic. In the latter case, the reference potentials are adjusted accordingly.

It should be understood that the foregoing description is only illustrative of the invention. Various alternatives and modifications can be devised by those skilled in the art without departing from the invention. For instance, while three field sensors have been shown, less sensors may be adequate (e.g. X and Y) to provide the desired field strength signal. Further, passive flux directing components can be used to sum the incident fields and to pass the summed fields to a single field sensor. While Hall effect devices have been described above as preferred field sensors, other magnetometer technologies can be employed, such as: magnetoresistive devices, saturation inductance devices, flux gate devices, and fiber optic sensors using magneto-optical materials. Accordingly, the present invention is intended to embrace all such alternatives, modifications and variances which fall within the scope of the appended claims.

What is claimed is:

1. A circuit for protection of a transportable electronics system in the presence of a high level electro-magnetic field, said circuit comprising:

field sense means for providing output signals indicative of component field strengths of said electro-magnetic field;

circuit means connected to said field sense means and responsive to said output signals for providing an output having a magnitude indicative of a vector strength of said electro-magnetic field;

first indicator means responsive to an output from said circuit means reaching a first threshold, for manifesting a signal that said vector strength of said electro-magnetic field has reached a cautionary level; and second indicator means including a comparator for issuing an indication which disables said electronic system when an output from said circuit means reaches a second threshold that is higher than said first threshold, said second indicator means further operative to remove said indication only when said output from said circuit means falls below said first threshold.

2. The circuit as recited in claim 1, wherein said first indicator means further actuates an audio alarm when said output from said circuit means exceeds said first threshold and further modulates said audio alarm to enable a listener to perceive variations of said vector strength of said electro-magnetic field between said first and second thresholds.

3. The circuit as recited in claim 1, wherein said second indicator means illuminates a warning light when a third threshold is reached that is between said first and second thresholds, but nearer the second threshold.

4. The circuit as recited in claim 1, wherein said field sense means comprises at least three Hall sense devices, each device oriented to sense a component field strength present along an axis of a three dimensional Cartesian coordinate system.

5. The circuit as recited in claim 1, wherein said first indicator means and second indicator means are configured as portions of a digital state machine.

6. A method for protection of a transportable electronics system in the presence of a high level electro-magnetic field, said method comprising the steps of:

providing output signals indicative of component field strengths of said electro-magnetic field;

combining said output signals to provide a vector output having a magnitude indicative of a vector strength of said electro-magnetic field;

when said vector output reaches a first threshold, manifesting a signal that said vector strength of said electro-magnetic field has reached a cautionary level; and when said vector output reaches a second threshold that is higher than said first threshold, issuing an indication to disable said electronics system, and removing said indication only when said vector output falls below said first threshold.

7. The method as recited in claim 6 including the further steps of:

actuating an audio alarm when said vector output exceeds said first threshold; and modulating said audio alarm to enable a listener to perceive variations of said vector strength of said electro-magnetic field between said first and second thresholds.

8. The method as recited in claim 6 comprising the further step of;

illuminating a warning light when said vector output reaches a third threshold that is between said first and second thresholds, but nearer the second threshold.

* * * * *